(12) United States Patent
Wang et al.

(10) Patent No.: US 7,259,380 B2
(45) Date of Patent: Aug. 21, 2007

(54) SCANNING MECHANISM OF AN ION IMPLANTER

(75) Inventors: Jinsong Wang, Beijing (CN); Yu Zhu, Beijing (CN); Jianyong Cao, Beijing (CN); Wensheng Yin, Beijing (CN); Guanghong Duan, Beijing (CN)

(73) Assignee: Tsinghua University, Beijing (CN)

( * ) Notice: Subject to any disclaimer, the term of this patent is extended or adjusted under 35 U.S.C. 154(b) by 279 days.

(21) Appl. No.: 11/155,973

(22) Filed: Jun. 17, 2005

(65) Prior Publication Data

US 2005/0285052 A1    Dec. 29, 2005

(51) Int. Cl.
*G21K 5/10* (2006.01)
*G01K 5/08* (2006.01)
*G01F 23/00* (2006.01)

(52) U.S. Cl. .......................... 250/442.11; 250/440.11; 250/441.11; 250/492.21

(58) Field of Classification Search ........... 250/492.21, 250/492.2, 442.11, 398, 492.3
See application file for complete search history.

(56) References Cited

U.S. PATENT DOCUMENTS

| | | | | |
|---|---|---|---|---|
| 6,575,676 B2 * | 6/2003 | Wang et al. | ................ | 409/201 |
| 6,761,518 B2 * | 7/2004 | Stengele et al. | ............ | 409/235 |
| 7,112,808 B2 * | 9/2006 | Ioannou et al. | ........ | 250/492.21 |
| 7,119,343 B2 * | 10/2006 | Asdigha et al. | ........ | 250/442.11 |
| 2005/0184253 A1 * | 8/2005 | Ioannou et al. | ........ | 250/492.21 |
| 2005/0247891 A1 * | 11/2005 | Asdigha et al. | ........ | 250/492.21 |
| 2005/0254932 A1 * | 11/2005 | Kellerman et al. | ......... | 414/680 |
| 2006/0097196 A1 * | 5/2006 | Graf et al. | ............. | 250/492.21 |
| 2006/0163471 A1 * | 7/2006 | Zapata et al. | ................ | 250/288 |

\* cited by examiner

*Primary Examiner*—Robert Kim
*Assistant Examiner*—Johnnie L Smith, II
(74) *Attorney, Agent, or Firm*—Michael Best & Friedrich LLP

(57) ABSTRACT

This invention discloses a scanning mechanism of an ion implanter. The mechanism is a PR-PRR type parallel mechanism with two subchains and two DOFs, driving the wafer holder to scan when the first subchain and the second subchain are translated in the same direction at the same speed and adjusting the rotational angle of the wafer holder when the first moving link (30) and the second moving link (32) in the first subchain and the second subchain have different translation amounts in the same direction or opposite directions. The driving motor for the scanning mechanism is provided outside the implant chamber. The invention also solves problems like low rigidity and large accumulation errors of existing serial scanning mechanisms and the effect of the electromagnetic field of the motor within the ion implant chamber on the trajectory of the ion beam.

12 Claims, 2 Drawing Sheets

SCANNING MECHANISM OF AN ION IMPLANTER

FIELD OF THE INVENTION

The invention relates to an ion implanter, and more particularly, to a scanning mechanism of an ion implanter.

BACKGROUND OF THE INVENTION

Ion implanters are applied widely in manufacturing semiconductor wafers. Before an ion beam is implanted, the angle between the normal axis of the surface of wafer 416 and the direction of the ion beam 404 (as shown in FIG. 1), named implant angle, is adjusted to a desired value. The wafer 416 is fixed on the wafer holder 414. When the ion beam is implanted, the wafer holder 414 is then driven to bring the wafer to perform repeatedly translational scan perpendicular to the direction of ion beam implantation, while maintaining implant angle unvaried. To ensure the dose of ion implantation over the wafer to be uniform, it's necessary to precisely control the implant angle and the scanning motion of the wafer holder 416.

In conventional ion implanters as shown in FIG. 1, a scanning mechanism with a wafer holder 414 which utilizes serial kinematic mechanism is installed in champer 700 (for example, as illustrated in International Publication No. WO02/43104 entitled "Hybrid scanning system and methods for ion Implantation" filed by Varian Semiconductor Equipment Associates, Inc. on May 30, 2002). In the so-called serial kinematic mechanism, there is provided only one kinematic chain from the wafer holder 414 to the location where the scanning mechanism is fixed to the wall 28 of ion implant chamber 700. In ion implant chamber 700 shown in FIG. 1, knuckle 604 is driven by motor 1 (not shown) to be rotatable around an axis 605, so as to adjust the implant angle at which ion beam 404 impinges on surface 418 of wafer 416. Meanwhile, wafer 416 together with wafer holder 414 and the like are driven by motor 2 to perform repeatedly translational scan along direction Y in the figure.

The above serial kinematic mechanism is fixed on wall 28 of the ion implant chamber by its fixing link. Motor 2 is installed outside the ion implant chamber and motor 1 that drives the wafer holder to rotate is arranged inside the ion implant chamber to be coupled with mechanism 604. The weight of motor 1, which is relatively large and increases the load of the scanning mechanism, leads to rise in the power consumption of motor 2 and being prone to cause the above serial scanning mechanism bent and distorted, thereby exacerbating error in angle control and scan control of the wafer.

SUMMARY OF THE INVENTION

An object of the invention is to provide a mechanism for controlling the implant angle and scan motion of a wafer holder in an ion implanter with two parallel subchains, to reduce the load of the scanning mechanism, thus protecting it from being bent and distorted, and to lower the power consumption of the motor installed in the scanning mechanism as well.

A scanning mechanism for the wafer holder in the ion implanter with two parallel subchains according to the invention has the following features to realize the above object of the invention, the scanning mechanism comprising:

a first subchain and a second subchain, for driving wafer holder (23) to scan and adjusting the rotational angle of wafer holder (23); wherein the first subchain is of PR type, comprising a first prismatic pair (21) and a first revolute pair (22); the first prismatic pair (21) comprising a first fixing link (29) and a first moving link (30); one end of the first moving link (30) being engaged with the wafer holder via the first revolute pair (22);

the first fixing link (29) is connected rigidly to wall (28) of the chamber of the ion implanter, the first moving link (30) capable of moving back and forth along its axial direction relative to the first fixing link (29), thus bringing the wafer holder to move;

the second subchain is of PRR type, comprising a second prismatic pair (24), a second revolute pair (25), a third revolute pair (26) and a third moving link (31); the second prismatic pair (24) comprising a second fixing link (33) and a second moving link (32); the second moving link (32) being engaged with one end of the third moving link (31) via the second revolute pair (25), and the other end of the third moving link (31) being engaged with the wafer holder (23) via the third revolute pair (26);

the second fixing link (33) is fixed rigidly to wall (28) of the chamber of the ion implanter, the second moving link (32) capable of moving back and forth along its axial direction relative to the second fixing link (33), thus bringing the wafer holder to move;

the first revolute pair (22) and the third revolute pair (26) are engaged with the wafer holder at different locations;

when the rotational angle of the wafer holder is adjusted, the first moving link (30) and the second moving link (32) have different translational amounts in the same direction or opposite directions; and when scan is performed, the first moving link (30) and the second moving link (32) move repeatedly in the same direction at the same speed.

Further detailed descriptions are given below on the scanning mechanism for adjusting the implant angle and realizing the scanning motion of a wafer holder in an ion implanter according to the invention, taken in conjunction with accompanying drawings.

DETAILED DESCRIPTION OF THE INVENTION

Figure 1:
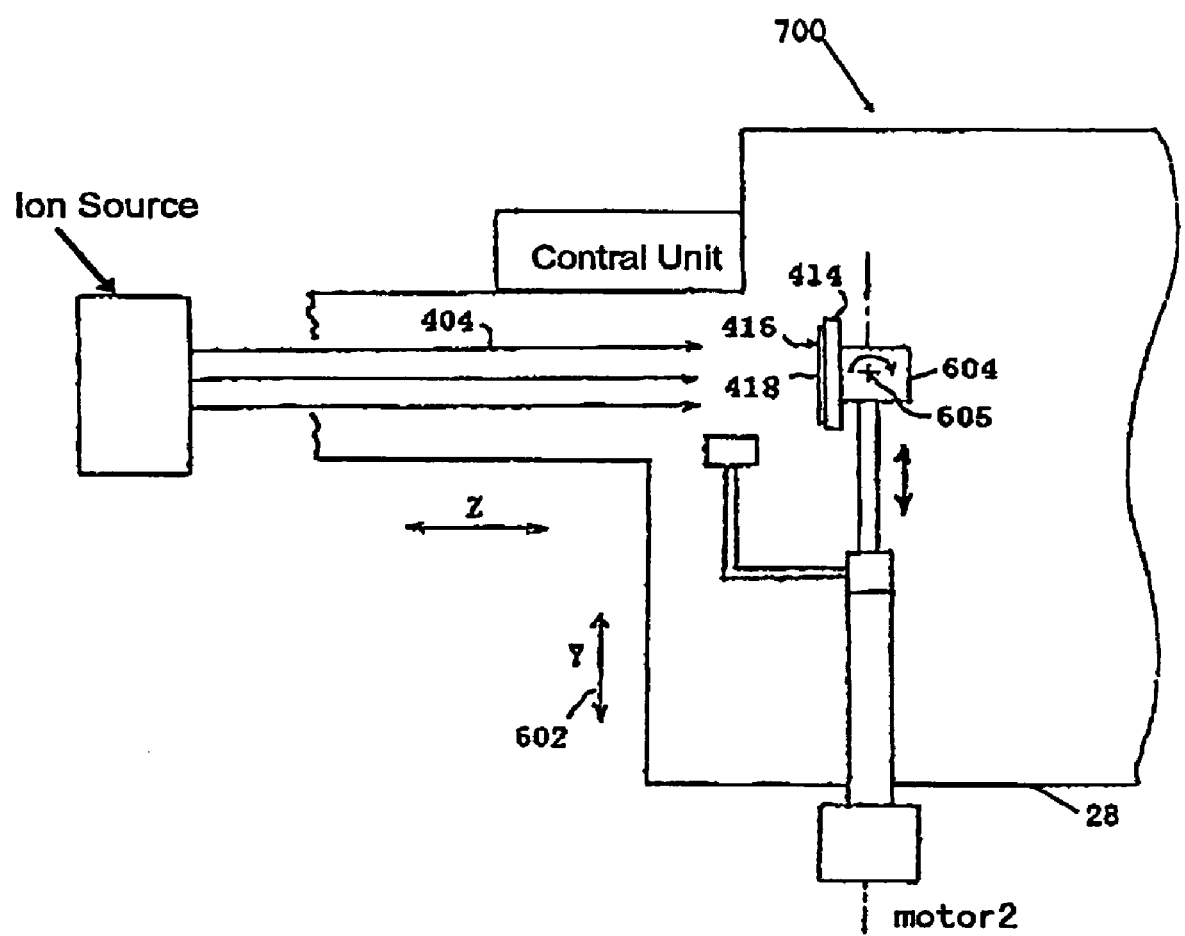
FIG. 1 is the sectional view of an example of a conventional scanning mechanism for adjusting the implant angle and realizing the scanning motion of a wafer holder in an ion implanter.
Figure 2:
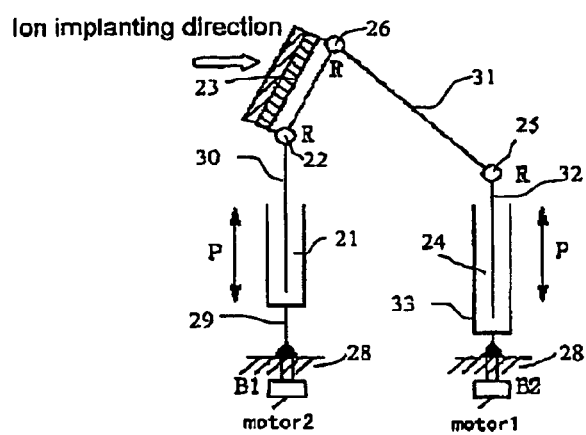
FIG. 2 is the simplified view of the parallel mechanism for adjusting the implant angle and realizing the scanning motion of a wafer holder in an ion implanter according to an embodiment of the present invention.

The present invention uses a 2-DOF (degree-of-freedom) parallel mechanism with two subchains to control rotational angle adjustment and scan of a wafer holder. In the so-called parallel mechanism, there are two subchains from the wafer holder to the wall of the chamber of the ion implanter where the 2-DOF parallel mechanism is fixed. FIG. 2 shows an example of the mechanism.

In the 2-DOF parallel mechanism with two subchains according to the invention, the first subchain takes the form of PR-type, i.e. it comprises a first prismatic pair 21 and a first revolute pair 22. The first prismatic pair 21 comprises a first fixing link 29 and a first moving link 30. Being driven by a motor, the first moving link 30 can move repeatedly with respect to the first fixing link 29 in its longitudinal axial direction, i.e. the direction as indicated by the double arrow P in the figure. The first fixing link is fixed rigidly to chamber wall 28 of the ion implanter and the first moving link 30 is engaged with the wafer holder via the first revolute pair such that the wafer holder is rotatable with respect to the first revolute pair.

The second subchain takes the form of PRR-type, comprising a second prismatic pair 24, and a third moving link 31, one end of which is engaged with the second prismatic pair 24 via a second revolute pair 25 and the other end of which is coupled to the wafer holder 23 via a third revolute pair 26. Wherein the first revolute pair and the third revolute pair are coupled to the wafer holder at different positions of the wafer holder, for example, they can be coupled to opposite ends of the wafer holder respectively. The second prismatic pair 24 comprises a second fixing link 33 and a second moving link 32, wherein the second fixing link 33 is fixed rigidly to a position on the chamber of the ion implanter different from the fixing point of the first fixing link 29. The second moving link 32 is capable of moving repeatedly in its longitudinal axial direction with respect to the second fixing link 33 (i.e. the direction as indicated by the double arrow P in the figure). The second prismatic pair is arranged such that the second moving link 32 has an longitudinal axis parallel with that of the first moving link 30, therefore, the second moving link 32 and the first moving link 30 can move repeatedly in the same direction or in the opposite direction.

In the 2-DOF parallel mechanism with two subchains of the present invention, the three revolute pairs may be cylindrical hinges capable of one-dimension rotating with their rotational axes being parallel. In the first prismatic pair 21 and second prismatic pair 24 of the two subchains, 2-DOF movement of wafer holder 23 can be realized through moving the first moving link 30 and the second moving link 32 respectively. When the first moving link 30 and the second moving link 32 are moving synchronously at the same speed, wafer holder 23 can scan repeatedly while maintaining the implant angle fixed. When the first moving link 30 and the second moving link 32 move in opposite directions or have different translation amounts in the same direction, the wafer holder is rotated thus the implant angle is changed. By geometric computations, the implant angle can be controlled, by controlling the translation amounts of the first moving link 30 and the second moving link 32.

Figure 3:
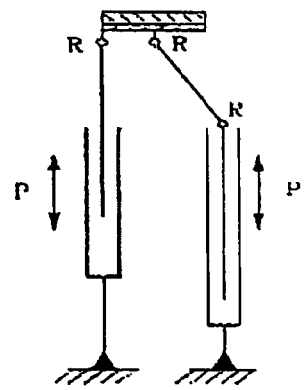
FIG. 3 shows the posture of the scanning mechanism of an ion implanter according to the invention when a wafer is loaded or unloaded.
Figure 4:
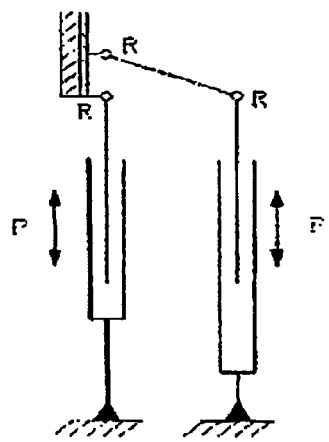
FIG. 4 is the simplified view of the parallel mechanism for adjusting the implant angle and realizing the scanning motion of a wafer holder in an ion implanter according to the present invention, where the implant angle is 0°.
Figure 5:
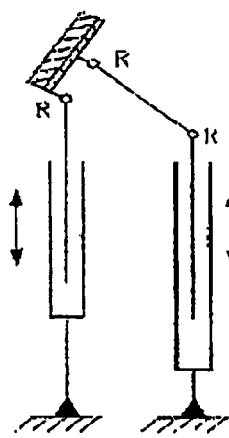
FIG. 5 is the simplified view of the parallel mechanism for adjusting the implant angle and realizing the scanning motion of a wafer holder in an ion implanter according to the present invention, where the implant angle is 30°.
Figure 6:
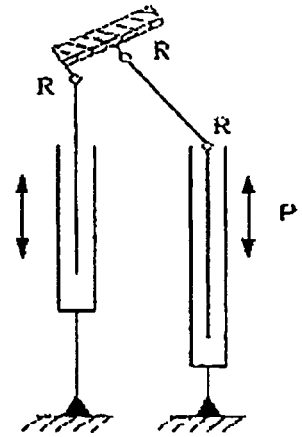
FIG. 6 is the simplified view of the parallel mechanism for adjusting the implant angle and realizing the scanning motion of a wafer holder in an ion implanter according to the present invention, where the implant angle is 60°.

To manufacturing a batch of wafers sequentially, the scanning mechanism need cooperate with a wafer input manipulator to realize automatic loading and unloading procedure for the wafers to/from the wafer holder, and at this time the wafer holder is normally in horizontal orientation as shown in FIG. 3. FIGS. 4 to 6 illustrate the postures of the parallel mechanism and the moving scenarios of the prismatic pairs when three different implant angles 0°, 30° and 60° are realized.

In the parallel mechanism as proposed in the present invention, the first prismatic pair 21 and the second prismatic pair 24 can be realized in many ways.

Figure 7:
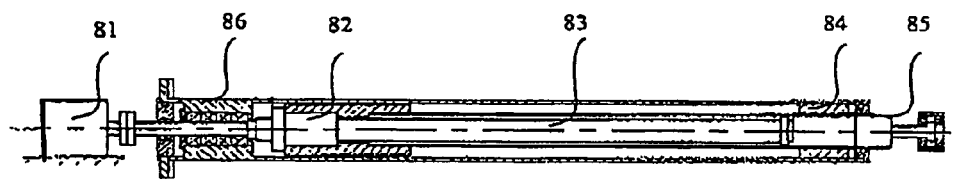
FIG. 7 shows the prismatic pair of the invention being implemented in a rotary motor and a ball screw.

As one example, a prismatic pair may have a structure comprising rotary servo motor and ball screw. As shown in FIG. 7, motor 81 is coupled directly to screw 83, and thus nut 82 is brought to move repeatedly along the axis when screw 83 rotates forward and backward, while nut 82 is connected rigidly with link 85, and thus link 85 perform repeated movement along the axial direction of screw 83. Bearing 84 in FIG. 7 prevents link 85 from moving in the direction perpendicular to its axial direction such that link 85 only performs linear movement in its axial direction. Comparing the simplified views of FIG. 7 and FIG. 2, link 85 in FIG. 7 corresponds to first moving link 30 and second moving link 32 in FIG. 2, and bearing 84 in FIG. 7 integrated with base 86 corresponds to the first fixing link 29 and the second fixing link 33 in FIG. 2.

As a second example, a prismatic pair may have a structure comprising rotary motor, linear guider and ball screw, wherein the first prismatic pair 21 and the second prismatic pair 24 employ linear guide, while the rotary motor and the ball screw constitute the driving structure of the prismatic pair.

As a third example, a prismatic pair may have a structure comprising linear motor and linear guide. Similar to the second one, the first prismatic pair 21 and the second prismatic pair 24 employ linear guides, whereas with difference from the second one in that the linear motor applies the driving power directly on the first moving link 30 or the second moving link 32.

In practical applications, an automatic detection unit can be used to detect the positions of the first moving link 30 and the second moving link 32 for the purpose of achieving the object of controlling the moving speeds and the translation amounts of the first moving link 30 and the second moving link 32. Specific detection approaches may vary with specific forms of the driving means of the subchains know from prior art. For a driving means including rotary servo motor and ball screw, the rotating angle of the rotary motor can be detected by rotary encoders and translation amounts of link 30 and link 32 can be calculated by multiplying the rotating angle with the transmission ratio of the ball screw. For a driving means including linear motor and linear guide, position detecting devices such as linear grating ruler may be used to measure positions of the first moving link 30 and the second moving link 32 directly.

While detailed description is above given to the invention, the foregoing illustration is merely exemplary and should not to be construed as limiting the invention. It is to be understood that various modifications and alterations can be made without departing from the spirit and the scope of the invention.

ADVANTAGEOUS EFFECTS OF THE INVENTION

The ion implanter of the present invention employs a new form for driving the wafer holder, i.e. a parallel mechanism with two subchains for driving the scan and rotation of the wafer holder. Compared with conventional serial scanning mechanisms (i.e. single subchain), the case in which the motor driving the wafer holder to rotate is driven to perform scanning motion as in prior art is avoided, thus it can overcome flaws such as being prone to be bent due to the heavy load of the moving mechanism and substantial power consumption of the motor driving the scan.

What is claimed is:

1. A scanning mechanism of an ion implanter, comprising:
a first subchain and a second subchain, for driving the wafer holder (23) to scan and adjusting the rotational angle of the wafer holder (23); wherein
the first subchain is of PR type, comprising a first prismatic pair (21) and a first revolute pair (22); the first prismatic pair (21) comprising a first fixing link (29) and a first moving link (30); one end of the first moving link (30) being connected to the wafer holder via the first revolute pair (22);
the first fixing link (29) is connected rigidly to a wall (28) of the chamber of the ion implanter, the first moving link (30) capable of moving repeatedly along its axis relative to the first fixing link (29), thus bringing the wafer holder to move;
the second subchain is of PRP type, comprising a second prismatic pair (24), a second revolute pair (25), a third revolute pair (26) and a third moving link (31); the second prismatic pair (24) comprising a second fixing link (33) and a second moving link (32); the second moving link (32) being connected to one end of the third moving link (31) via the second revolute pair (25), the other end of the third moving link (31) being connected to the wafer holder via the third revolute pair (23);
the second fixing link (33) is connected rigidly to the chamber wall (28) of the ion implanter, the second moving link (32) capable of moving repeatedly along its axis relative to the second fixing link (33), thus bringing the wafer holder to move;
the first revolute pair (22) and the third revolute pair (26) are connected to the wafer holder at different positions of the wafer holder;
when the implant angle is adjusted, the first moving link (30) and the second moving link (32) have different translation amounts in the same direction or opposite directions; and
when scan is performed, the first moving link (30) and the second moving link (32) move repeatedly in the same direction at the same speed.

2. The scanning mechanism of an ion implanter according to claim 1, wherein,
the first subchain and the second subchain are driven by a driving means.

3. The scanning mechanism of an ion implanter according to claim 2, wherein,
the driving means comprises a motor/motors and a conversion mechanism for the motor movement.

4. The scanning mechanism of an ion implanter according to claim 3, wherein,
the motor/motors and the movement conversion mechanism is/are divided into two groups, with one group driving the first subchain and the second subchain respectively.

5. The scanning mechanism of an ion implanter according to claim 3, wherein,
the motor/motors is/are provided outside the chamber of the ion implanter.

6. The scanning mechanism of an ion implanter according to claim 1, wherein,
the first fixing link (29) and the second fixing link (33) are fixed rigidly at different positions on the same side of the chamber of the ion implanter.

7. The scanning mechanism of an ion implanter according to claim 1, wherein,
when the first moving link (30) and the second moving link (32) have different translation amounts or opposite translational directions to adjust the angle of the wafer holder surface relative to the direction of ion beam implantation, the incident angle of the ion beam over the wafer holder surface can vary in the range from more than or equal to 0° to less than or equal to 90°.

8. The scanning mechanism of an ion implanter according to claim 1, wherein,
the first prismatic pair (21) and the second prismatic pair (24) have a structure comprising rotary servo motor and ball screw.

9. The scanning mechanism of an ion implanter according to claim 1, wherein,
the first prismatic pair (21) and the second prismatic pair (24) have a structure comprising rotary motor, linear guider and ball screw.

10. The scanning mechanism of an ion implanter according to claim 1, wherein,
the first prismatic pair (21) and the second prismatic pair (24) have a structure comprising linear motor and linear guider.

11. The scanning mechanism of an ion implanter according to claim 1, wherein,
the first revolute pair (22), the second revolute pair (25) and the third revolute pair (26) are cylindrical hinges.

12. The scanning mechanism of an ion implanter according to claim 11, wherein,
the rotating axes of the first revolute pair (22), the second revolute pair (25) and the third revolute pair (26) are parallel to each other.

* * * * *